United States Patent [19]

Anthony

[11] Patent Number: 4,589,190

[45] Date of Patent: May 20, 1986

[54] FABRICATION OF DRILLED AND DIFFUSED JUNCTION FIELD-EFFECT TRANSISTORS

[75] Inventor: Thomas R. Anthony, Schenectady, N.Y.

[73] Assignee: General Electric Company, Schenectady, N.Y.

[21] Appl. No.: 593,013

[22] Filed: Mar. 23, 1984

[51] Int. Cl.$^4$ .................... H01L 21/38; H01L 21/465
[52] U.S. Cl. ........................................ 29/571; 29/580; 148/187; 148/188; 148/189; 357/20; 357/22
[58] Field of Search ................... 29/571, 580; 148/187, 148/188, 189; 357/22, 20

[56] References Cited

U.S. PATENT DOCUMENTS

| | | | |
|---|---|---|---|
| 3,007,119 | 10/1961 | Barditch | 357/22 X |
| 3,969,745 | 7/1976 | Blocker | 357/22 X |
| 4,137,100 | 1/1979 | Zaleckas | 148/1.5 |
| 4,327,475 | 5/1982 | Asai et al. | 29/571 |
| 4,463,366 | 7/1984 | Ishii et al. | 357/22 |
| 4,482,907 | 11/1984 | Jay | 357/22 |

OTHER PUBLICATIONS

"Forming Electrical Interconnections Through Semiconductor Wafers", by T. R. Anthony, *J. Appl. Physics*, 52(8), Aug. 1981, pp. 5340–5349.
"Forming Feedthroughs in Laser-Drilled Holes in Semiconductor Wafers by Double-Sided Sputtering", by T. R. Anthony, *IEEE Trans.*, CHMT-5(1), Mar. 1982, pp. 172–180.
"Diodes Formed by Laser Drilling and Diffusion", by T. R. Anthony, *J. Appl. Phys.*, 53(12), Dec. 1982, pp. 9154–9164.

*Primary Examiner*—George T. Ozaki
*Attorney, Agent, or Firm*—Paul E. Rochford; James C. Davis, Jr.; James Magee, Jr.

[57] ABSTRACT

A method for fabricating junction field-effect transistors includes forming in an N-type silicon substrate a plurality of high-aspect-ratio bores interposed between a source region and a drain region in the substrate, diffusing P-type impurities a predetermined distance into the substrate from the inner surface to each bore to form a concentric, P-type gate zone around each bore, forming electrical contacts to the source and drain regions and to the gate zones and forming a P-type isolation zone surrounding the source and drain regions and the gate zones. The bores, which are preferably formed by laser drilling, extend completely or partially through the thickness of the substrate. The gate zones extend, either completely through the thickness of the substrate or from the top surface of the substrate to a layer-like P-type zone formed adjacent to the bottom surface thereof. The method provides a junction field-effect transistor structure in which the conducting channel extends through nearly the entire thickness of the substrate and, therefore, results generally in a more compact device.

29 Claims, 11 Drawing Figures

FABRICATION OF DRILLED AND DIFFUSED JUNCTION FIELD-EFFECT TRANSISTORS

CROSS-REFERENCE TO RELATED APPLICATIONS

The present invention is related to the invention disclosed and claimed in commonly assigned U.S. patent application Ser. No. 267,234, filed May 26, 1981 and now abandoned and also in continuation-in-part application Ser. No. 544,935 filed Oct. 24, 1983, now U.S. Pat. No. 4,570,173.

BACKGROUND OF THE INVENTION

The present invention relates generally to junction field-effect transistor (JFET) devices and more particularly to a method for fabricating JFET devices and the devices produced by the method.

The junction field-effect transistor, also referred to as the unipolar transistor, is known in the art. Such a device was first proposed by William Shockley in an article entitled "A Unipolar Field Effect Transistor" published in the *Proceedings of the IRE* 40, p. 1365 (1952). The first experimental demonstration of the JFET was reported by G. C. Dacey and I. M. Ross in an article entitled "Field Effect Transistor" published in the *Bell System Technical Journal* 34, p. 1149 (1955). Today the JFET is in widespread use, particularly as discrete devices for high power applications.

Electrical current in a JFET is transported entirely by majority carriers of a single polarity (i.e., electrons or holes). Hence the JFET is also known as the unipolar transistor. Current flow through the JFET is largely controlled by varying the width of a depletion layer associated with a P-N junction formed between a gate zone and a conducting channel of the device, the cross-sectional area of the conducting channel being altered by the variation in the width of the depletion layer.

In recent times, JFETs are most commonly fabricated using planar silicon technology. A typical JFET structure 10 fabricated with such technology is illustrated in FIG. 1. Referring now to FIG. 1, a relatively low impurity concentration N-type silicon layer 1 is epitaxially grown on a relatively high impurity concentration P-type (P+) silicon substrate 2. A relatively high impurity concentration P-type gate zone 3 is then formed by a masked diffusion of P-type impurities from the exposed surface 13 of the epitaxial layer 1. The gate zone is interposed between a source region 4 and a drain region 5 of the N-type layer 1. Finally, gate, source and drain contacts are formed by means of strip-like metallic layers 6, 7 and 8 deposited on the surfaces of the gate zone 3, the source region 4 and the drain region 5, respectively. In order to insure good electrical contact to the relatively low impurity concentration source and drain regions it is generally necessary to increase the surface impurity concentration of those regions by an additional masked diffusion of N-type impurities into the top surface beneath the source and drain contacts 7 and 8. Such a contact diffusion step is not illustrated in FIG. 1.

When appropriate bias voltages are applied to the gate, source and drain contacts, 6, 7 and 8 and to the substrate 2, current flows from the source region 4 to the drain region 5 through an N-type region 9 bounded by the depletion layers 11 and 12 of the P-N junctions between the gate zone 3 and the N-type region 9 and between the substrate 2 and the N-type region 9, respectively. The portion of the N-type region 9 between the depletion layers 11 and 12 is commonly referred to as the channel of the device. The resistance of the channel is proportional to its length L and inversely proportional to its width W and its thickness. The thickness of the channel may be expressed as the thickness d of the N-type region 9 less the widths $w_1$ and $w_2$ of the depletion layers 11 and 12, respectively. Therefore, the channel resistance of the device may be varied by altering the depletion layer widths $w_1$ and $w_2$ through appropriate changes in the voltages applied to the device, and the minimum channel resistance of the JFET is proportional to the channel width W and the gate zone-to-substrate distance d and inversely proportional to the channel length L.

Certain applications for the JFET require that the device be capable of carrying relatively high currents. For such applications it is necessary to fabricate the JFET to have a relatively low minimum channel resistance. In fabricating JFET devices for high current applications, conventional methods of fabrications which use an epitaxial layer have the problem in that owing to the impracticality of growing thick epitaxial layers, the devices fabricated by such methods generally have a relatively small gate zone-to-substrate distance d. Consequently, in order to fabricate a JFET having a low minimum channel resistance using conventional methods, it is necessary to provide the device with a relatively large channel width W. In so doing, the lateral dimensions of the JFET device must be made relatively large, and the number of devices that can be formed on a substrate wafer is accordingly reduced. For that reason, high current JFETS are costly to manufacture using conventional fabrication methods.

In this regard it is also noted that in the JFET device fabricated by conventional methods, most of the device structure in the vertical direction is inactive, since the active device regions, i.e., gate zone 3, the source and drain regions 4 and 5 and the channel, are all confined to the epitaxial layer 1 which has a thickness t many times smaller than the thickness T of the substrate 2.

Therefore, a need clearly exists for a method for fabricating high current JFET devices which are more compact and less costly to manufacture. Furthermore, a need exists for a fabrication method which provides a JFET structure in which the active device regions extend through substantially the entire thickness of the substrate.

SUMMARY OF THE INVENTION

The foregoing problems of the prior art have been overcome by the present invention which in one aspect is a method for fabricating junction field-effect transistor devices wherein a plurality of spaced-apart, relatively small diameter, high-aspect-ratio, substantially mutually parallel bores are formed in an appropriately doped semiconductor body. The bores, which are preferably formed by laser drilling, are interposed between a source and a drain region of the body. Impurities of a conductivity type opposite to that of the body are then brought into contact with the inner surface of each bore and diffused a predetermined distance into the body from the inner surface so as to form a plurality of spaced-apart gate zones, each one being concentric with a respective one of the bores and having a generally uniform cross-section. Finally, electrical contacts are made to the gate zones and to the source and drain regions by means of metallic layers formed in contact with the surfaces of the gate zones and the source and drain regions, respectively.

The bores may be formed to extend completely through the thickness of the body between top and bottom surfaces thereof, in which case the gate zones are formed to be substantially coextensive with the bores. Alternatively the bores may be formed to extend into the body from the top surface thereof to a substantially uniform predetermined depth, in which case the gate zones may be formed to either extend completely through the thickness of the body or extend to a layer-like zone of the same conductivity type as the gate zone formed in the body adjacent to the bottom surface thereof.

The bores and the gate zones are advantageously disposed along a straight line lying between the source and drain regions or in an array having a plurality of mutually orthogonal rows and regularly spaced columns. Furthermore, there may also be formed an isolation zone completely surrounding the gate zones and the source and drain regions. The isolation zone, which is of the same conductivity type as the gate zones, may extend completely through the thickness of the body or it may extend from the top surface of the body to a layer-like zone of the same conductivity type as the isolation zone formed in the body adjacent to the bottom surface thereof.

Another aspect of the present invention is the structure of the JFET device produced by the foregoing method. The structure includes a plurality of bores in a semiconductor body and a plurality of gate zones which are concentric with respective ones of the bores and interposed between a source and a drain region of the body. The vertically disposed gate zones, which are of a conductivity type opposite to that of the body, when appropriately biased with respect to the source and drain regions may be used to control the lateral current flow between those regions. The JFET device structure of the present invention allows nearly the entire thickness of the body to be utilized for the channel and therefore provides a more compact device.

DETAILED DESCRIPTION

Figure 1:
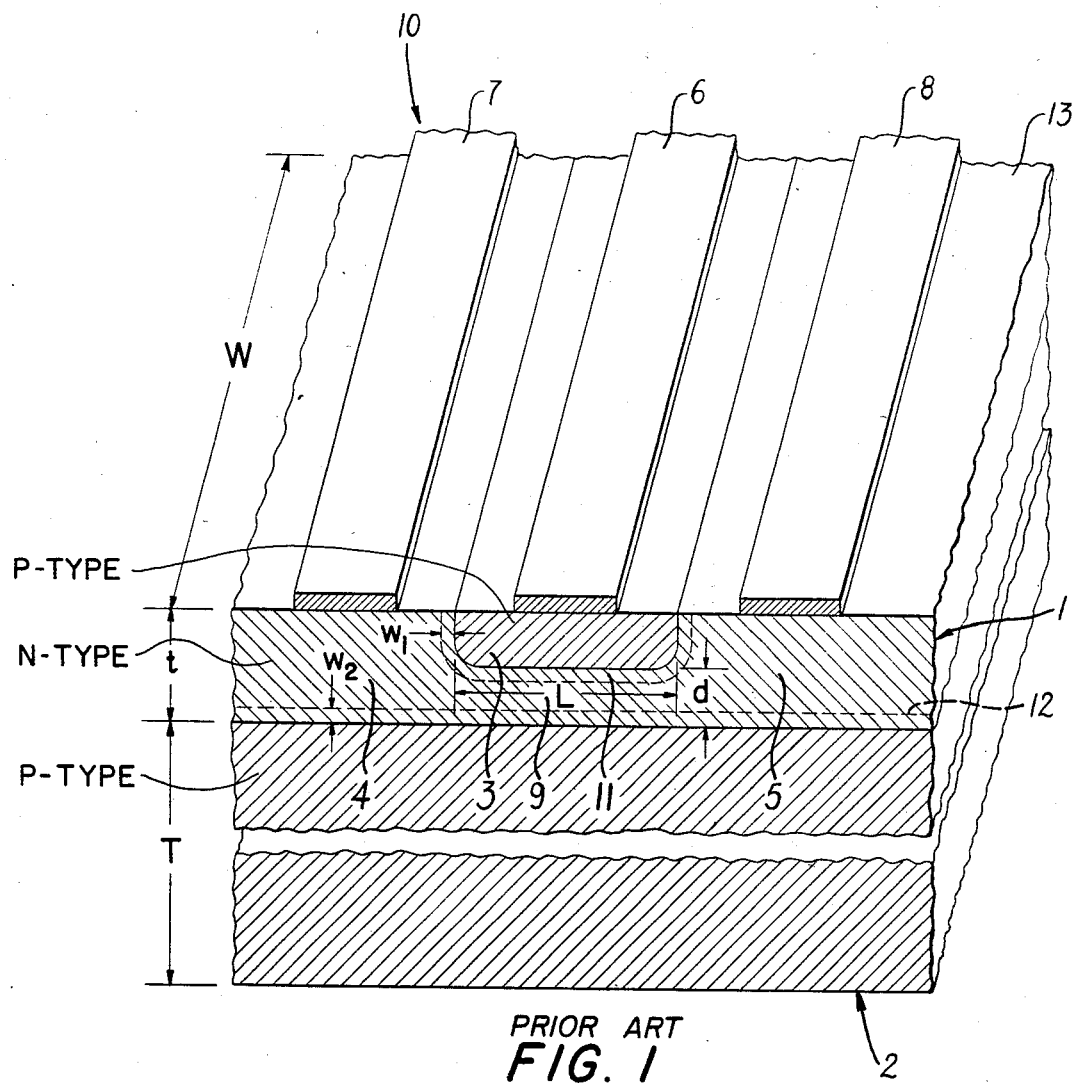
FIG. 1 is partially sectional, isometric view of a JFET device fabricated with a conventional planar silicon technology.

Exemplary embodiments of the present invention will now be explained with references to the appended Figures of the drawing in which the same reference numerals and characters are used to denote like regions, zones, dimensions and features of the device.

Figure 2:
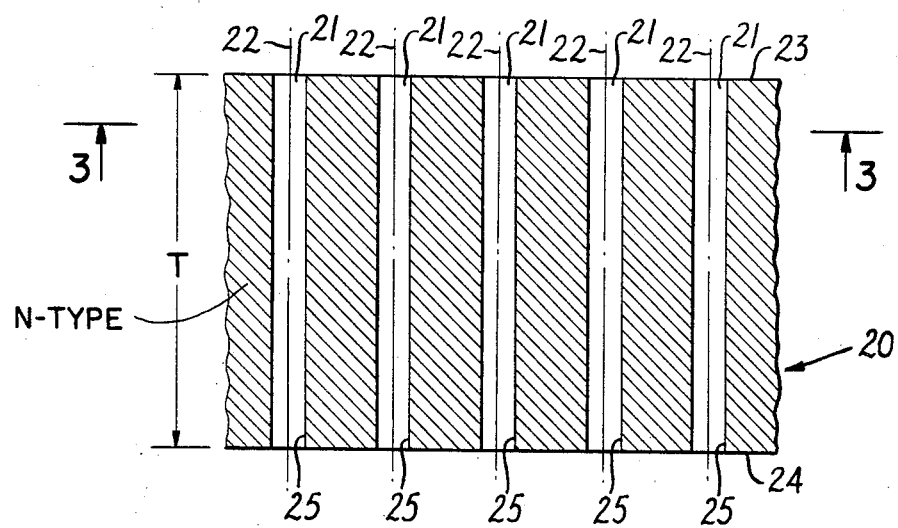
FIG. 2 is a cross-sectional view of a portion of a silicon body in which there has been formed five high-aspect-ratio bores extending through the entire thickness of the body between two major surfaces thereof.

Referring now to FIG. 2, five high-aspect ratio (i.e., a length to diameter ratio of greater than 6) bores 21 are formed in a portion of a semiconductor body 20. The bores 21 extend completely through the thickness of the body 20 between two opposing major surfaces 23 and 24 thereof. The body 20 comprises a substrate wafer of N-type, single crystalline silicon having a thickness T of about 12 mils (1 mil=0.001 inches) and a substantially uniform impurity concentration of approximately $1 \times 10^{14}$ atoms/cm$^3$ of phosphorus.

The bores 21, which are interior lengthwise cylindrical cavities of generally circular cross-section, are formed by a technique called "laser drilling" in which a high intensity, focussed laser beam is used to excavate, cavities in the body 20 through local vaporization and removal of the material of the body in the vicinity of the beam. The laser used was an ESI, Inc. Model 25 Laser Scribing System modified with a 10 watt (maximum) optoacoustic Q-switched Nd:YAG head manufactured by U.S. Laser Corp. The laser was operated in a repetitively Q-switched mode with a focussed beam diameter of about 20 $\mu$m, a depth of focus of about 250 $\mu$m, a pulse duration of about 200 nanoseconds, and a repetition rate of about 3 KHz. With the average power of the laser set at about 2 watts and the laser pulse-width and delay between successive pulses set at about 5 msec and 10 msec, respectively, the bores 21 can be "drilled" at a rate of approximately 5 holes, per second.

Although in the present embodiment, the bores 21 are drilled completely through the thickness of the semiconductor body 20, the laser-drilling technique may likewise be used to drill blind bores extending partially through the thickness of the body. By carefully controlling the number of laser pulses used for each bore, blind bores of a desired depth may be reproducibly formed. A calibration curve of depth of bore versus number of laser pulses may be empirically derived to aid the practitioner in drilling bores of uniform or varying depths.

During the laser drilling process, the semiconductor body 20 is held in a special vacuum chuck which does not have any reflective metallic supporting surfaces adjacent the body which can cause unwanted reflections of the laser beam, particularly as the beam closely approaches the reflective surface. Such reflections can produce irregularly sized bores. Another benefit of the inventive chuck is that it permits debris from the laser drilling to be ejected downwardly away from the bottom surface 24 of the body 20 thus facilitating the formation of a clean, well-defined aperture in the bottom surface 24 when the bores are drilled completely through the body 20.

When the laser is operated in the above-described manner, the bores 21 formed by laser drilling have substantially circular cross-sections of uniform diameter, and the inner surfaces 25 of the bores are substantially circular cylindrical surfaces. However, the present invention is not limited to bores which are circular cylindrical cavities, as cavities of other cross-sectional shapes formed by, for example, changing the operating parameters of the laser may be used. It is also advantageous to form the bores such that their axes 22 are mutually parallel.

Some surface blemishes, caused by the fallout of debris from the bores during drilling, were observed when laser drilling was performed on uncoated silicon wafers. These blemishes were eliminated by precoating both sides of the wafer with black acrylic spray paint prior to drilling and removing the coating with toluene after drilling. In this manner the debris from drilling the bores were stripped away with the paint coating. Other coatings such as photoresist, paraffin, or silicone grease should be equally suitable for removing the debris, but are less easily stripped than acrylic spray paint.

Figure 3:
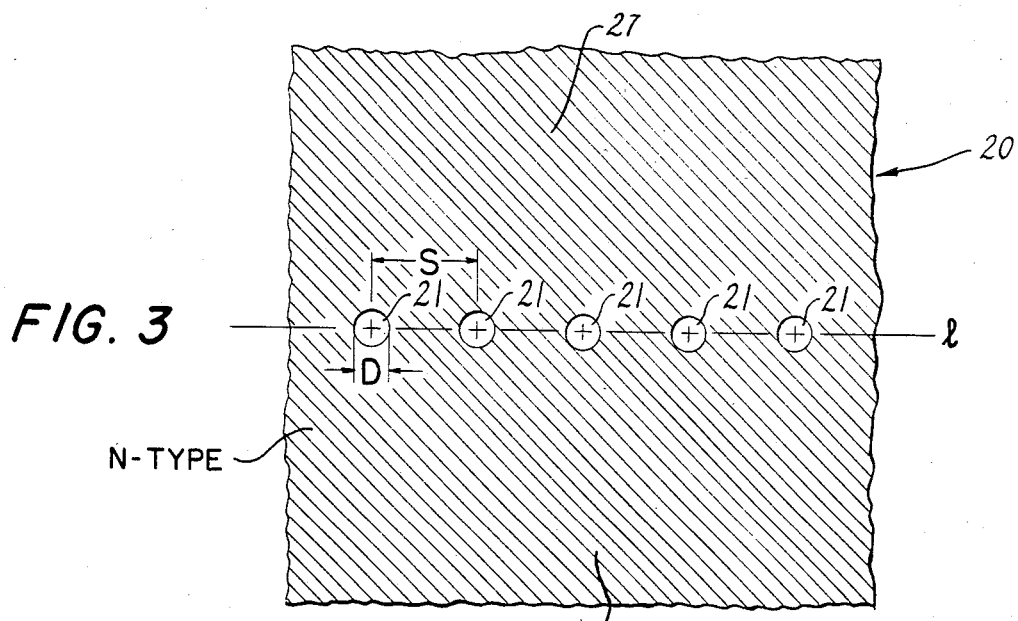
FIG. 3 is a top view of the silicon body of FIG. 2 taken along plane 3—3 of FIG. 2.

Turning now to FIG. 3, the bores 21, which have diameters D of about 1 mil and center-to-center spacings S of about 4 mils, are interposed between a source region 27 and a drain region 28 of the semiconductor body 20. In general a JFET is a bilateral device in which the source and drain electrodes are interchangeable. Therefore, whether a device region connected to such an electrode is denominated a source or a drain region depends on how that region is biased with respect to other device regions during operation. However, for purposes of explanation, it is assumed that the device of FIG. 2 will be operated in such a manner that region 27 is the source region and region 28 is the drain region. The bores 21 are disposed along a straight line 1 which lies between the source and drain regions.

After the drilling operations, the body was checked to determine the extent to which any stresses or strains were introduced into the regions adjacent to the bores by the laser drilling operation. Polarized infrared light was used to check for the presence of stress, since if stress is present, the silicon becomes birefringent. No patterns indicative of stress in the silicon adjacent to the bores were observed.

Two methods were used to check for the presence of dislocations which are indicative of residual strains in the silicon body caused by the laser drilling. In the first method dislocations are decorated by copper precipitates. A saturated solution of $Cu(NO_3)_2$ was applied to the top surface through which the laser beam entered the body. The body and solution were heated to 900° in dry hydrogen for one hour and quenched in air. Inspection with infrared light revealed an absence of copper-decorated dislocations, which led to the conclusion that the regions adjacent to the holes were strain-free. In the second method, Dash's etch (1 part HF, 3 parts $HNO_3$ and 10 parts acetic acid) was applied to the top surface at room temperature. The absence of any aggressive localized pitting of the silicon body adjacent to the bores caused by the etch indicated the absence of dislocations and confirmed the results obtained by the first method that the regions adjacent to the bores were strain-free.

The absence of strains and stresses in the regions adjacent to the bores is the result of the selection of laser-drilling parameters and fixturing of the water. The use of short laser pulses minimizes diffusion of heat into the silicon surrounding the bore and, therefore, also minimizes any thermal stress and the resulting damage to the silicon lattice.

Figure 4:
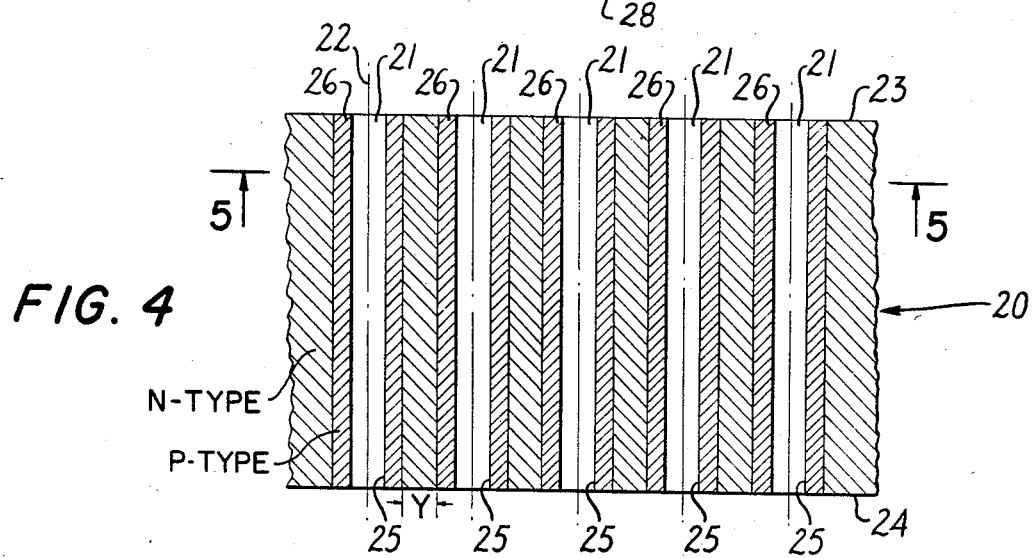
FIG. 4 is a cross-sectional view of the silicon body of FIG. 2 following the formation of gate zones concentric with the bores.

Referring now to FIG. 4, following the formation of the bores 21, the semiconductor body 20 undergoes processing to form relatively high impurity concentration P-type gate zones 26 of generally uniform cross-section and substantially concentric with respective ones of the bores 21. An appropriate P-type impurity is introduced into the body 20 through the inner surface 25 of each bore. As used hereinafter, the term "concentric" refers to two or more cylindrical figures having a common axis of symmetry.

There are several diffusion techniques which may be used to form the impurity zones 26. One technique is to use a liquid "spin-on" solid state source of diffusible boron, such as Spin-Rite TM manufactured and sold by Diffusion Technology, Inc. of Sunnyvale, Calif. Following the formation of the bores, the semiconductor body is held in a vacuum check, and several drops of the spin-on liquid source are applied to the top surface 23 of the body 20. It is not necessary to spin the body 20, in as much as the spin-on liquid spreads uniformly over the top surface 23, the inner surfaces 25 of the bores and bottom surface 24 under the combined actions of surface tension, capillary force and the vacuum.

The coated body is then baked at 150° C. for 1 hour in a nitrogen atmosphere to drive off any residual solvent. In preparation for the pre-deposit bake, the body is placed in a cold laboratory oven, and a flow of 500 cc/ in $O_2$ plus 2000 cc/min $N_2$ is initiated. The body is then heated to 1100° C., held at 1100° C. for 30 minutes and cooled in the oven at about 1.5° C./min to 600° C. Thereafter, the body is removed from the oven and cooled to room temperature in still air. The oxide layer formed during the pre-deposit bake is removed with HF acid. The impurity is then driven deeply into the interior of the body by heating the wafer in a laboratory oven from room temperature to 1250° C., holding at 1250° C. for 15 hours, cooling in the laboratory oven to about 1.5° C./min to 600° C. and cooling to room temperature outside the oven in still air. Since the same $O_2/N_2$ flowing atmosphere used during the pre-bake step was used during the drive step, a new oxide film is formed during the drive step which can either be patterned or removed. Since the impurity has simultaneous access to the entire cross-section of the body in the zones in which the impurity is to be introduced, i.e., the inner bore surfaces, the diffusion times for forming such deep impurity zones are considerably reduced over other known methods.

Those skilled in the art of semiconductor device processing will recognize that unless special measures are taken, the impurity will also diffuse into the body from the other exposed surfaces thereof, e.g., the top and bottom surfaces 23 and 24. Therefore, after the diffusion operation, approximately 60 $\mu$m of material is removed from the top and bottom surfaces 23 and 24 of the body 20 by mechanical polishing to eliminate the layer-like P-type zones which are formed adjacent those surfaces. Alternatively, the formation of the layer-like zones may be prevented by masking those regions of the top and bottom surfaces 23 and 24 where impurity diffusion is not desired by means of an appropriately patterned diffusion mask, such as a thermally grown oxide layer.

Figure 5:
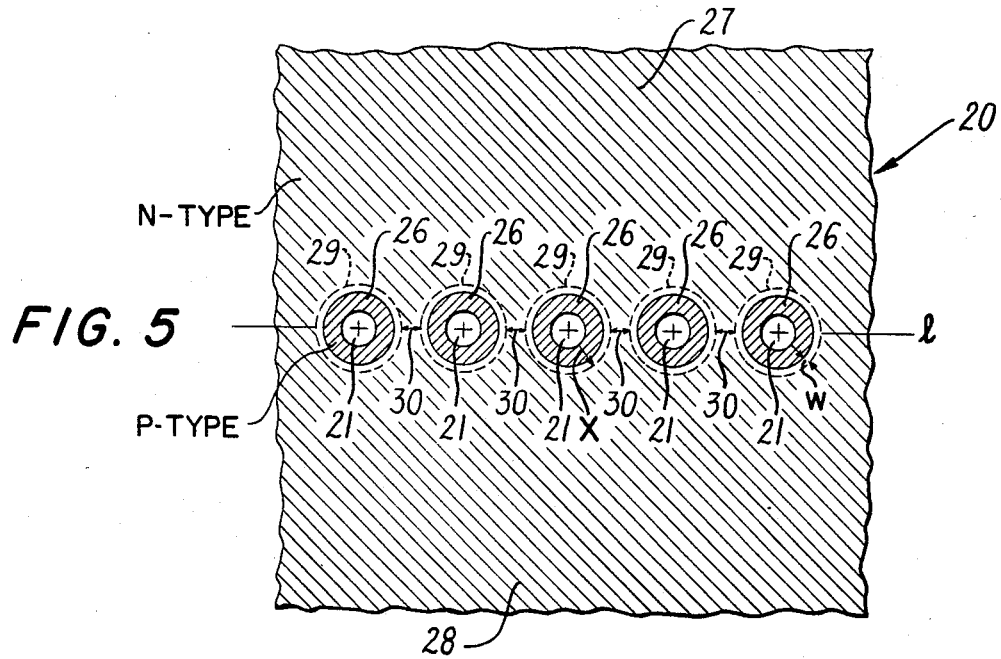
FIG. 5 is a top view of the silicon body of FIG. 4 taken alone plane 5—5 of FIG. 4.

Each of the P-type zones 26 concentrically surround a respective one of the bores 21 and form PN junctions with the N-type material of the body 20 at a radial distance R of approximately 1 mil beyond the inner bore surface as shown in FIG. 5.

Another technique for forming substantially equivalent P-type zones 26 is to use a gaseous diffusion source of P-type impurities. For example, the body 20 is heated to 1120° C. in the presence of a carrier gas containing aluminum for approximately 35 hours. The carrier gas has a nominal composition of 7% $H_2$ and 93% Ar. Alternatively, the above-described carrier gas may contain a different P-type impurity, such as gallium. In the case of gallium, the body is heated at 1120° C. for approximately 72 hours to achieve the same results as obtained with aluminum. After the diffusion operation, the top and bottom surfaces 23 and 24 of the body 20 are mechanically polished to a depth of about 60 μm to remove the layer-like zones formed adjacent to those surfaces. The above-described method for forming high-aspect-ratio diffused zones in a semiconductor body by means of drilling bores in the body and diffusing impurities into the body through the inner walls of the bores is disclosed and claimed in the above cross-referenced application U.S. Pat. No. 4,570,173, which is incorporated herein by reference.

Referring to FIG. 5, during normal operation of the device, the P-type gate zones 26 are electrically interconnected by means of a gate contact (not shown) described hereinbelow and biased negatively with respect to the N-type portions of the body 20. Therefore, depletion regions 29 are established around each of the gate zones 26. The spaces 30 between the depletion regions 29 collectively serve as the channel of the device. Since the widths w of the depletion regions 29 may be altered by modifying the negative bias on the gate zones, current conduction between the source and drain regions 27 and 28 may be controlled by varying the voltage applied between the gate zones 26 and the channel 30. The resistance of the channel 30 may be changed from a relatively low value when the width w of the depletion regions 29 is a minimum to a relatively very high value when the depletion regions of adjacent gate zones overlap. Ignoring the effects of current leakage around the periphery of the device and assuming a device with two gate zones, the resistance R of the channel is approximately expressed as:

$$R = \frac{(D + 2X)}{q_N N_D (S - D - 2X - w2W)(T - 2X - 2w)} \quad (1)$$

where D is the diameter of the bores, X is the distance between the P-N junction to the inner surface of the bore, S is the center-to-center spacing between adjacent bores, w is the width of the depletion region, T is the thickness of the body, $q_n$ is the electronic charge, $\mu_N$ is the electron mobility in the lightly-doped N-type portions of the body and $N_D$ is the donor concentration in such portions of the body. The depletion region width w is expressed generally as:

$$w = \left(\frac{2k_s\epsilon_o V_R}{qN_D}\right)^{\frac{1}{2}} \quad (2)$$

where $k_s$ is the dielectric constant of silicon, $\epsilon_o$ is the permittivity of free space, q is the electronic charge, $N_D$ is the donor concentration of the lightly doped portions of the body and $V_R$ is the reverse bias voltage between the gate zones and the N-type portions of the body. In the present example where $N_D = 10^{14}$ atoms/cm$^3$, X=0.001 inch, D=0.001 inch and S=0.004 inch, the turn-off voltage of the device (i.e., the gate-to-drain voltage at which the resistance of the device is maximum) is approximately 10 volts. In general, the minimum resistance of the channel will be inversely proportional to the number of gate zones used. However, on account of the channel 30 extending through the entire thickness of the body 20, for a given channel resistance, a JFET device fabricated according to the present invention will generally have smaller lateral dimensions than a JFET device fabricated according to conventional methods.

Figure 6:
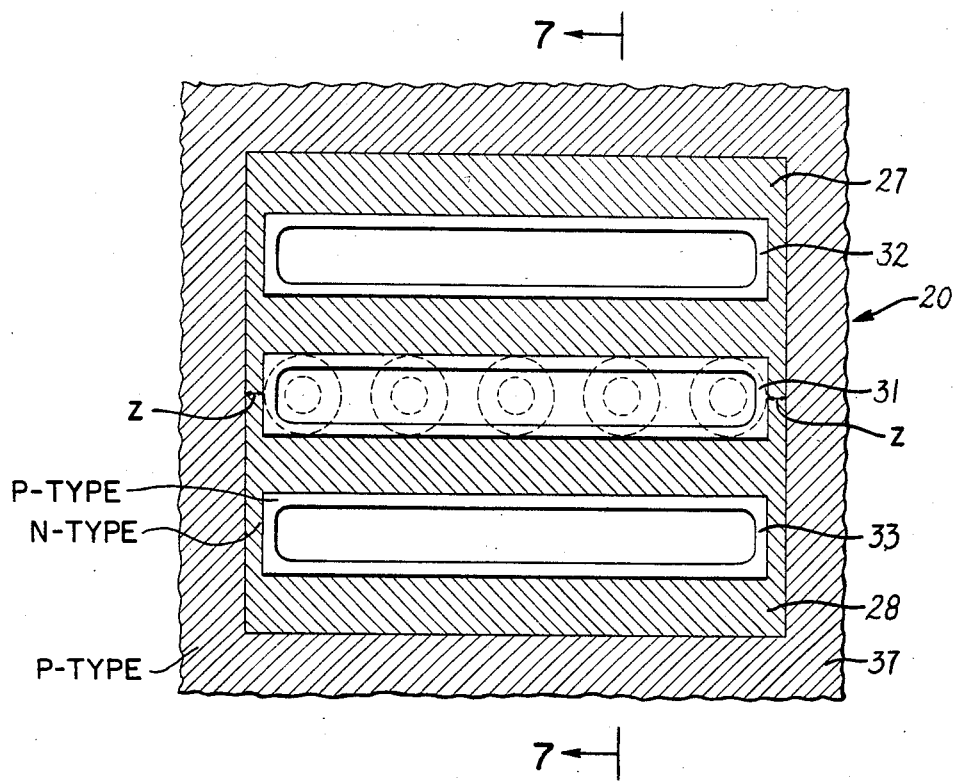
FIG. 6, is a plan view of a JFET device fabricated according to the present invention illustrating source, drain and gate contacts and an isolation zone.
Figure 7:
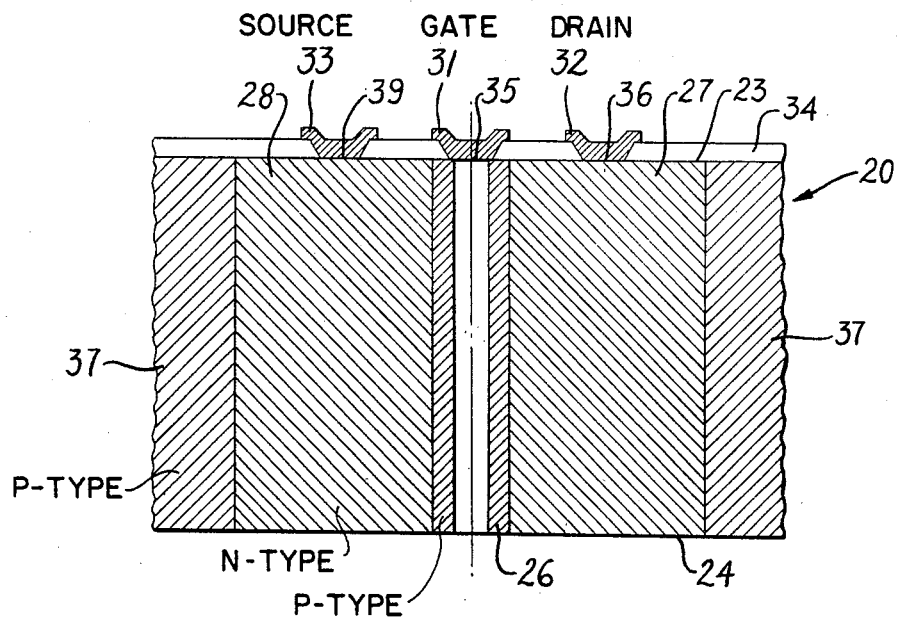
FIG. 7 is a sectional view of the JFET device of FIG. 6 taken along plane 7—7 of FIG. 6.

Turning now to FIGS. 6 and 7, following the formation of the P-type gate zones 26, the semiconductor body undergoes further processing to provide electrical contacts 31, 32 and 33 to the gate zones 26, the source region 27 and the drain region 28, respectively. The contacts are formed by a conventional technique of first growing a silicon dioxide layer 34 over the entire top surface 23 of the body 20. The silicon dioxide layer 34 is then patterned by known photolithographic and etching techniques to open contact windows 35, 36 and 39 to expose portions of the top surface over each of the gate zones 26, the source region 27 and the drain region 28, respectively. It should be noted that the contact windows 35 for the gate zones do not overlap the N-type regions of the body. A layer of an appropriate metal, such as aluminum, is then vacuum deposited over the entire top surface 23 of the body 20 and patterned by conventional photolithographic and etching techniques to form strip-like contact layers 31, 32 and 33 which serve as connection means for the gate zones 26, the source region 27 and the drain region 28, respectively. As mentioned above, it may be necessary to increase the surface concentration of the relatively lightly doped source and drain regions 27 and 28 beneath the contact layers 32 and 33 prior to the deposition of such layers in order to ensure low resistance, ohmic electrical contacts to those regions. Such an increase in surface impurity concentration may be obtained, for example, by a conventional masked diffusion step prior to the formation of the contacts, in which an appropriate N-type impurity such as phosphorus or arsenic is diffused into the top surface 23 of the body 20 in the areas to be contacted by the layers 32 and 33 to form shallow, high impurity concentration surface zones beneath those layers. Such surface zones are omitted from the depiction in FIGS. 6 and 7.

It is generally desirable from the standpoint of minimizing the leakage current of the JFET device to surround each device with a relatively heavily-doped P-type isolation zone 37. The spacing Z between the isolation zone 37 and nearest gate zone 26 is advantageously made equal to the spacing Y between adjacent gate zones. Where more than one JFET device are formed in the same semiconductor body an isolation zone around each device is generally required to electrically isolate the device from the others in the body. The isolation zone 37 may be formed by conventional techniques, such as by diffusion of an appropriate P-type impurity (e.g., boron or antimony) from the top surface 23 or from both the top and bottom surfaces 23 and 24 prior to the formation of the gate zones 26. However, a better technique for forming the isolation zone 37 is to first use the above described laser drilling technique to create a series of nearly overlapping peripheral bores which define the shape of the isolation zone. The peripheral bores are advantageously formed to extend through the entire thickness of the body and to have a diameter of about 1 mil and a bore axis-to-bore axis spacing of about 1.5 mils. Then using the same diffusion step which forms the gate zones 26, concentric P-type zones are formed around each one of the peripheral bores. Owing to the closeness of the spacing between adjacent peripheral bores, the P-type zones formed around such bores overlap to provide a continuous isolation zone surrounding the device. The technique of forming an isolation zone by drilling closely spaced high-aspect-ratio bores and diffusing overlapping concentric impurity zones is disclosed and claimed in the above cross-referenced application U.S. Pat. No. 4,570,173. This technique provides an isolation zone having narrower lateral dimensions than conventional techniques. Therefore, the use of this technique contributes to achieving a more compact JFET device.

The gate zones 26 of the JFET device need not be arranged along a straight line as shown in FIGS. 5 and 6, but may be arranged in an arbitrary manner so long as the gate zones are interposed between the source region 27 and drain region 28 and positioned and spaced to provide the desired variation in channel resistance through appropriate changes in the voltages applied to the device. For example, the gate zones may be disposed in an array having a plurality of rows and regularly spaced columns as shown in FIG. 8.

Figure 8:
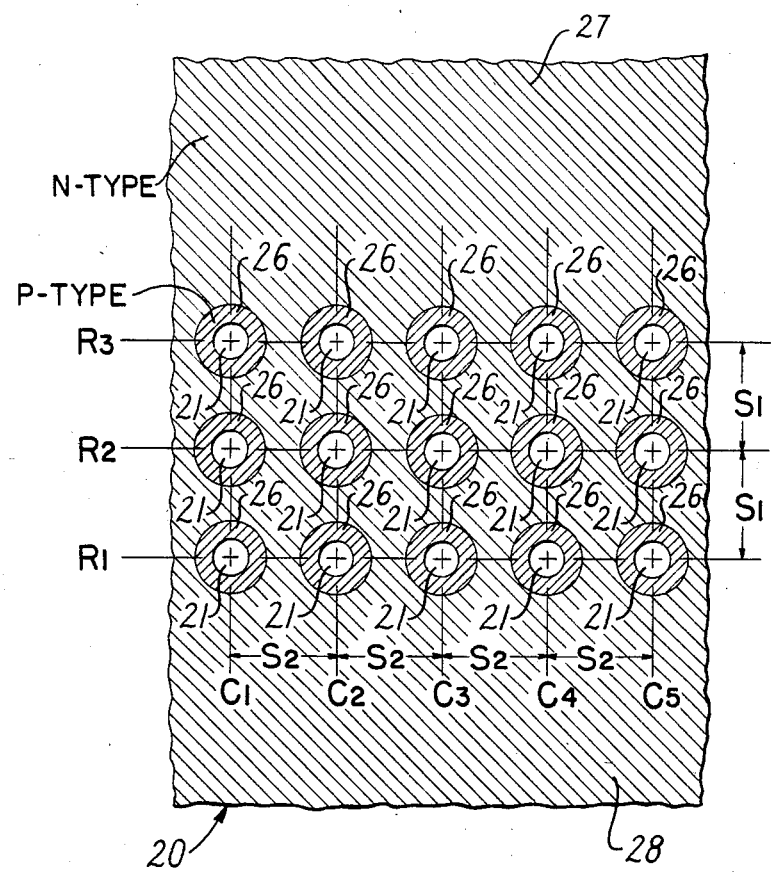
FIG. 8 is a top view of a portion of a silicon body in which there has been formed fifteen high-aspect ratio bores arranged in an array having three rows and five columns.

Referring now to FIG. 8, the gate zones 26 are formed by first drilling bores 21 at each intersection of the three rows R1–R3 and the five columns C1–C5 of a matrix array. The bores are advantageously drilled to have a diameter of about 1 mil, a row spacing S1 of about 45 mils and a column spacing S2 of about 4 mils. One of the above-described diffusion techniques is then used to form a concentric gate zone around each one of the bores 21. The impurities are diffused into the semiconductor body 26 from the inner surface of each bore to a depth of approximately 1 mil. The remaining processing steps are the same as those described in the preceding exemplary embodiment. It should be noted that the metallic layer for the gate contact (not shown in FIG. 8) makes electrical contact to each of gate zones 26 in the array. The use of an array of gate zones provides a JFET having a lower turn-off voltage (i.e., the gate-to-drain voltage at which the depletion layers around adjacent gate zones overlap) than that provided by the use of a single row of gate zones. However, the lower turn-off voltage is achieved at the expense of a higher minimum channel resistance. In general, the turn-off voltage of the device decreases and the minimum channel resistance increases as the number of rows in the array increases. Although it is highly desirable for the columns C1–C5 of the array to have a regular spacing S2, there is no similar preference for spacing of the rows R1–R3 of the array.

Figure 9:
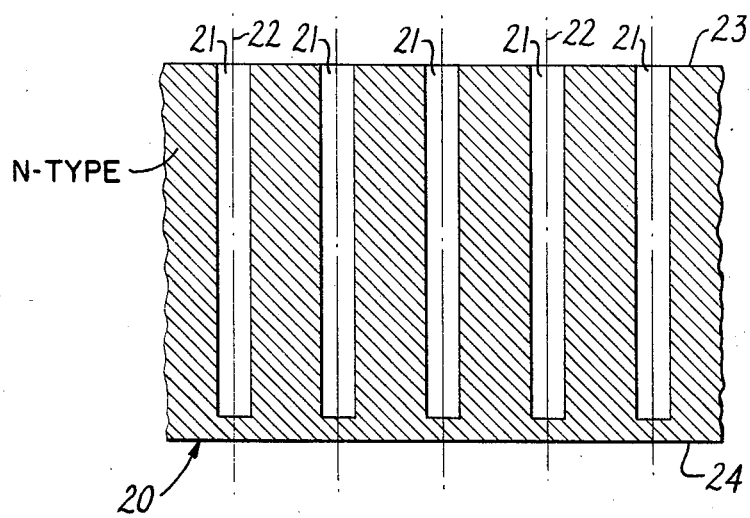
FIG. 9 is a cross-sectional view of a portion of a silicon body in which there has been formed five high-aspect-ratio blind bores.

According to the present invention, the bores 21 around which the gate zones 26 are formed need not extend completely through the thickness of the body 20. In some instances, it may be desirable to use blind bores 21 drilled to a uniform predetermined depth from the top surface 23 of the body 20 as shown in FIG. 9. For example, the substitution of blind bores facilitates the use of a vacuum chuck to hold the body during processing. Blind bores may be formed by the above-described pulse laser drilling technique by carefully controlling the number of laser pulses used to drill each bore.

Figure 10:
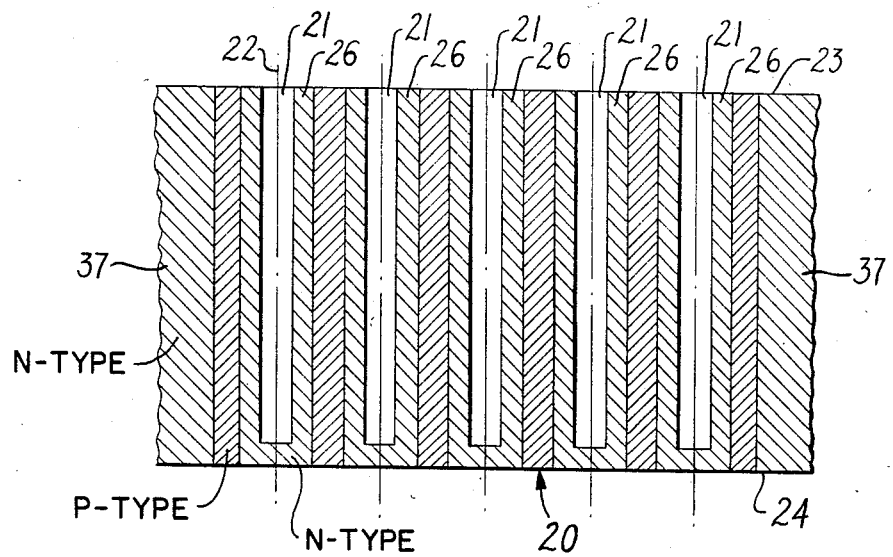
FIG. 10 is a view of the silicon body of FIG. 9 following the formation of gate zones which extend through the entire thickness of the body to form an isolation zone.

Turning now to FIG. 10, gate zones 26 which extend through the entire thickness of the body 20 may be formed around blind bores 21 by drilling each bore to within a boron diffusion distance from the bottom surface 24 of the body 20. The boron diffusion distance is the distance that the boron impurities diffuse beyond the bottom of the blind bores 21 during the formation of the gate zones 26. FIG. 10 depicts the body 20 following the formation of the gate zones 26 and the isolation zone 37 and after the removal of the layer-like P-type zones which are formed adjacent the top and bottom surfaces of the body during the gate zone diffusion step.

Figure 11:
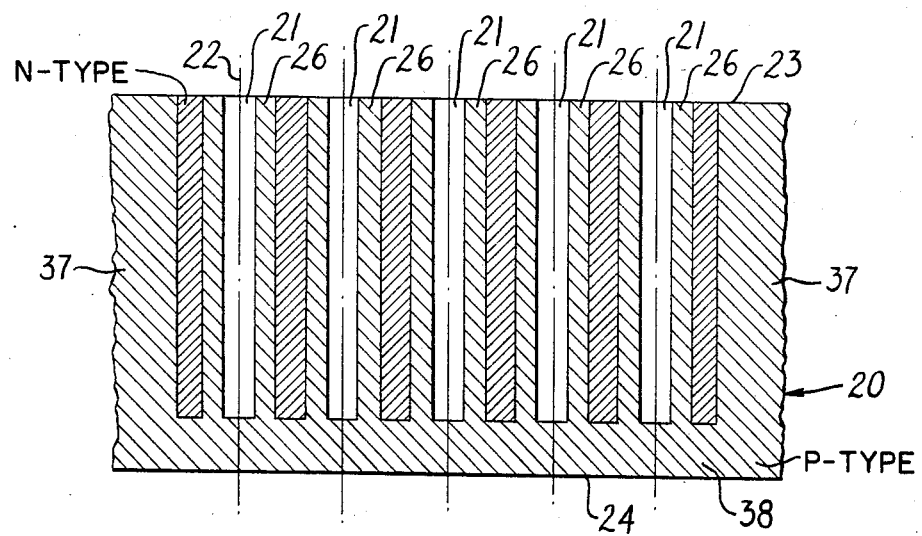
FIG. 11 is a view of the silicon body of FIG. 9 following the formation of an isolation zone a layer-like zone adjacent the bottom surface of the body and gate zones which extend from the top surface of the body to the layer-like zone.

Alternatively, the gate zones 26 which are formed around blind bores 21 may extend partially through the thickness of the body 20 to contact a layer-like P-type zone 38 adjacent the bottom surface 24 of the body as shown in FIG. 11. The layer-like zone 38 may be formed either by a separate processing step using a conventional diffusion or ion-implantation technique or it may be the layer-like zone which is formed adjacent the bottom surface 24 during the gate zone formation step.

The above and other modifications, alterations and substitutions may be made to the disclosed embodiments by one skilled in the art of semiconductor device processing without departing from the spirit and scope of the present invention as defined by the appended claims. For example, the material of the body is not limited to single crystalline bulk silicon, as other semiconductor materials suitable for fabricating JFET devices may be substituted. In addition, the semiconductor body may be initially P-type, in which case the gate and isolation zones are formed by the diffusion of appropriate N-type impurities. Furthermore, the bores may be formed by techniques other than laser drilling.

What I claim and desire to secure by Letters Patent of the United States is:

1. A method of fabricating junction field-effect transistor device comprising the steps of:
   (a) forming a plurality of spaced-apart, high-aspect-ratio substantially mutually parallel bases in and at least partially through a monocrystalline silicon semiconductor body of a first conductivity type by laser drilling, the bores being interposed between a first region and a second region of the body;
   (b) forming in the body a plurality of spaced apart first zones of a second conductivity type by bringing a first impurity of a second conductivity type into contact with the inner surface of each bore and diffusing the first impurity a predetermined distance into the body from the inner surface such that each of the first zones is substantially concentric with a respective one of the bases and has a generally uniform cross-section; and
   (c) forming first connection means making electrical contact with each of the first zones and second and third connection means for making electrical contact to the first and second regions of the body, respectively.

2. The method of claim 1 wherein the step of forming the bores includes forming the bores to extend completely through the thickness of the body between two opposing major surfaces thereof, and the step of forming the first zones includes forming the first zones to extend between the two opposing surfaces of the body.

3. The method of claim 2 wherein the step of forming the bores includes forming the bores to be regularly spaced and disposed generally along a straight line between the first and second regions of the body.

4. The method of claim 3 wherein the step of forming the first, second and third connection means includes depositing respective metallic layers overlying one of the major surfaces of the body, the metallic layer of the first connection means being in contact with each of the first zones and the metallic layers of the second and third connection means being on contact with the first and second regions, respectively.

5. The method of claim 4 wherein the step of forming the bores includes boring the body with laser beam means.

6. The method of claim 5 further comprising the step of forming in the body a second zone of the second conductivity type surrounding the first and second regions and the first zones and extending between the two major surfaces of the body.

7. The method of claim 6 wherein the first conductivity type is N-type and the second conductivity type is P-type.

8. The method of claim 7 wherein the step for forming the bores includes forming the bores to have a generally circular cross-section with a diameter of approximately 0.001 inch and a bore center-to-bore center spacing between neighboring bores of approximately 0.004 inch, and the step of forming the first zones includes diffusing the first impurities to a distance of approximately 0.001 inch into the body from the inner surface of each bore.

9. The method of claim 2 wherein the step of forming the bores includes forming the bores to be generally disposed in an array having a plurality of rows and a plurality of regularly spaced columns.

10. The method of claim 9 wherein the step of forming the first, second and third connection means includes depositing respective metallic layers overlying one of the major surfaces of the body, the metallic layer of the first connection means being in contact with each of the first zones and the metallic layers of the second and third connection means being on contact with the first and second regions, respectively.

11. The method of claim 10 wherein the step of forming the bores includes boring the body with laser beam means.

12. The method of claim 1 wherein the step of forming in the body a second zone of the second conductivity type surrounding the first and second regions and the first zones and extending between the two major surfaces of the body.

13. The method of claim 12 wherein the first conductivity type is N-type and the second conductivity type is P-type.

14. The method of claim 13 wherein the step for forming the bores includes forming the bores to have a generally circular cross-section with a diameter of approximately 0.001 inch and a bore center-to-bore center spacing between neighboring bores of approximately 0.004 inch, and the step of forming the first zones includes diffusing the first impurities to a distance of approximately 0.001 inch into the body from the inner surface of each bore.

15. The method of claim 1 wherein the step of forming the bores includes forming the bores into the body from one of the two major surfaces thereof to a substantially uniform predetermined depth.

16. The method of claim 15 further comprising the step of forming in the body a layer-like third zone of the second conductivity type underlying the other one of the major surfaces of the body and being contiguous with each of the first zones of the body.

17. The method of claim 15 wherein the step of forming the bores includes forming the bores to extend to within the predetermined first impurity diffusion distance of the other one of the major surfaces of the body, and the step of forming the first zones include forming the first zones to extend between the two major surfaces of the body.

18. The method of claim 16 wherein the step of forming the bores includes forming the bores to be regularly spaced and disposed generally along a straight line between the first and second regions of the body.

19. The method of claim 18 wherein the step of forming the first, second and third connection means includes depositing respective metallic layers overlying one of the major surfaces of the body, the metallic layer of the first connection means being in contact with each of the first zones and the metallic layers of the second and third connection means being in contact with the first and second regions, respectively.

20. The method of claim 19 wherein the step of forming the bores includes boring the body with laser beam means.

21. The method of claim 20 further comprising the step of forming in the body a second zone of the second conductivity type surrounding the first and second regions and the first zones and extending between the two major surfaces of the body.

22. The method of claim 21 wherein the first conductivity type is N-type and the second conductivity type is P-type.

23. The method of claim 22 wherein the step for forming the bores includes forming the bores to have a generally circular cross-section with a diameter of approximately 0.001 inch and a bore center-to-bore center spacing between neighboring bores of approximately 0.004 inch, and the step of forming the first zones including diffusing the first impurities to a distance of approximately 0.001 inch into the body from the inner surface of each bore.

24. The method of claim 16 wherein the steps of forming the bores includes forming the bores to be disposed in an array having a plurality of rows and a plurality of regularly spaced columns.

25. The method of claim 24 wherein the step of forming the first, second and third connection means includes depositing respective metallic layers overlying one of the major surfaces of the body, the metallic layer of the first connection means being in contact with each of the first zones and the metallic layers of the second and third connection means being in contact with the first and second regions, respectively.

26. The method of claim 25 wherein the step of forming the bores includes boring the body with laser beam means.

27. The method of claim 26 wherein the step of forming in the body a second zone of the second conductivity type surrounding the first and second regions and the first zones and extending between the two major surfaces of the body.

28. The method of claim 27 wherein the first conductivity type is N-type and the second conductivity type is P-type.

29. The method of claim 28 wherein the step for forming the bores includes forming the bores to have a generally circular cross-section with a diameter of approximately 0.001 inch and a bore center-to-bore center spacing between neighboring bores of approximately 0.004 inch, and the step of forming the first zones includes diffusing the first impurities to a distance of approximately 0.001 inch into the body from the inner surface of each bore.

* * * * *